(12) United States Patent
Takekuma et al.

(10) Patent No.: US 7,963,674 B2
(45) Date of Patent: Jun. 21, 2011

(54) LIGHT EMITTING DIODE PACKAGE HAVING FLEXIBLE PCT DIRECTLY CONNECTED TO LIGHT SOURCE

(75) Inventors: Akira Takekuma, Tama (JP); Chew Tong Fatt, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 413 days.

(21) Appl. No.: 11/923,274

(22) Filed: Oct. 24, 2007

(65) Prior Publication Data

US 2008/0101066 A1    May 1, 2008

(30) Foreign Application Priority Data

Oct. 25, 2006 (JP) ................. 2006-289444

(51) Int. Cl.
*F21S 4/00* (2006.01)
*F21V 21/00* (2006.01)
(52) U.S. Cl. ............. 362/249.04; 362/240; 257/98; 257/99; 257/100

(58) Field of Classification Search .......... 362/240, 362/245, 362, 249.04; 257/98, 88, 99, 100
See application file for complete search history.

(56) References Cited

U.S. PATENT DOCUMENTS

| | | | |
|---|---|---|---|
| 2005/0045904 A1* | 3/2005 | Chen | 257/100 |
| 2006/0097245 A1* | 5/2006 | Aanegola et al. | 257/26 |
| 2006/0231856 A1* | 10/2006 | Kanno et al. | 257/99 |

* cited by examiner

*Primary Examiner* — Stephen F Husar

(57) ABSTRACT

A light emitting diode package comprising a substrate electrically connectable to an external unit with a reduced height. A flexible PCB for electrical connection between a light emitting diode and the external unit is directly connected to a light emitting element. The direct connection is conducted by applying a conductive resin to an electrode on the flexible PCB, on which the light emitting element is mounted; mounting the light emitting element; curing the conductive resin in a high-temperature furnace. The present invention requires neither a lead frame for electrical connection of the light emitting element to the flexible PCB nor a rigid PCB for supporting the flexible PCB, thus reducing the total height of the light emitting diode package.

10 Claims, 3 Drawing Sheets

LIGHT EMITTING DIODE PACKAGE HAVING FLEXIBLE PCT DIRECTLY CONNECTED TO LIGHT SOURCE

This application claims priority from Japanese Patent Application Number 2006-289,444, filed Oct. 25, 2006, of Akira Takekuma and Chew Tong Fatt, which is hereby incorporated by reference for all that is disclosed herein.

BACKGROUND OF THE INVENTION

1. Field of the Invention

The present invention relates to a light emitting diode package structure, and particularly relates to a structure for electrically connecting a light emitting diode to an external unit via a flexible PCB.

2. Description of Related Art

Compact electrical devices typified by mobile devices such as recent digital still cameras and mobile phones, often employ a flexible print circuit board (hereafter referred to as "FPCB") as substrates for electrical connection between units or circuits for reduction in size and weight. Relatively small and light components such as chip components are sometimes directly soldered on FPCBs. For soldering an LED on an FPCB, a surface mount LED is generally used from a viewpoint of easiness of size reduction and assembling.

FIG. 8 shows one example of a surface mount light emitting diode package 80 having such a conventional structure. FIG. 8 illustrates a light emitting diode (LED) 82, which comprises a light emitting element (LED chip), a wire (gold wire) for electrical connection to the light emitting element, a conductive resin for conduction of an electrode at the bottom surface of the light emitting element (components mentioned heretofore being not shown), a lead frame 85, a transparent encapsulation resin 83 such as an epoxy resin serving as a lens, and a flange 84. There are provided soldering 86 for electrical connection between the lead frame 85 and a conductive pad of an FPCB 87, and a rigid PCB 88.

As shown in FIG. 8, the LED 82 is mounted on the FPCB 87 by soldering the lead frame 85 to the FPCB 87. The rigid PCB 88 as a rigid body is attached to a rear surface of the FPCB 87 as a support for the soldering. Further, when the light emitting diode package is pressed at its rear surface by a leaf spring to securely hold the light emitting diode package in a unit, the rigid PCB is required to provide a hard flat surface for contact with the leaf spring.

Other conventional structures using lead frames are disclosed in Japanese Patent Laid-open Publications 2001-177, 160 (FIG. 10) and H9-83,018 (FIG. 1).

SUMMARY OF THE INVENTION

A conventional light emitting diode package structure as shown in FIG. 8 requires the lead frame 85 for soldering the LED 82 to the FPCB 87, in addition to the rigid PCB 88. Further, when the lead frame 85 is mounted on the FPCB 87, it is necessary to bend the lead frame 85 at such a large angle as to prevent cracks or the like, which requires the flange 84 to have a relatively large thickness. Therefore, a light emitting diode package that includes a rigid PCB in addition to a light emitting diode comprising a lens (encapsulant), a flange, and a lead frame, has a relatively large total height. This is a problem for thickness reduction of a mobile device that has to mount a light emitting diode package with a construction shown in the figure.

In addition, heat generated by soldering the lead frame 85 to the FPCB 87 may cause operational defects such as deterioration of optical output and no lighting of the LED 82, thereby leading to deterioration in quality or reliability. An operational defect of this type is caused by exfoliation of an encapsulation resin from an LED chip or wire cutting, which is attributed to a fact that the thermal expansion degree of the encapsulation resin by soldering heat is varied depending on the location.

In order to avoid such LED operational defect, there have been constraints on design, for example: to select components composed of high-temperature resistant materials as components for an LED; not to use a component having a shape susceptible to high temperatures; and to dispose components at locations less affected by thermal expansion. These constraints creates barriers to develop LEDs having new shapes or structures, for example, an ultra-compact LED susceptible to thermal influence.

For a conventional light emitting diode package utilizing a lead frame for connecting an LED to an FPCB, it is difficult to reduce the total height of the light emitting diode package. For example, one component constituting a light emitting diode package is a lens formed of an encapsulant, and height reduction of the lens reduces the brightness of the LED. Further, a flange is used as other component, and the flange has to have a certain level of thickness in relation with a bending angle of the lead frame as described above. It is therefore difficult to reduce the height of the flange.

One object of the present invention is to reduce the height of a light emitting diode package by eliminating a rigid PCB and a lead frame, thereby to reduce a size of a device carrying the LED.

Another object of the present invention is to avoid an operational defect of an LED attributable to heat generated by soldering a lead frame to a rigid PCB, thereby to improve the quality and reliability of the LED.

In a light emitting diode package (hereinafter referred to as "LED package") of the present invention, an FPCB used for electrical connection between an LED and an external unit is directly connected to a light source of LED chip to be integrated with the LED. The LED package of the present invention comprises an LED chip as a light source, an encapsulant for covering the LED chip, and a flexible PCB, in which the flexible PCB is a thin substrate having first and second surfaces and the LED chip is disposed on the first surface of the flexible PCB.

In the present invention, soldering of a lead frame to an FPCB as shown in FIG. 8 as conventional art is not employed for connecting an LED to an FPCB, but an LED chip is directly connected to an FPCB. An FPCB of this type is extendable to the outside of the LED package, and thus the LED can be electrically connected to an external unit via the FPCB. In this case, an electrical terminal can be provided at a proper location of the FPCB outwardly extended from the LED package. This electrical terminal may be a connector electrically connectable to an external unit or a lead pad (conductive pad) connectable to a connector for an external unit. This permits connection to an external unit by mechanical means without soldering.

The present invention does not require a lead frame for electrically connecting an LED to an FPCB, and thereby a certain level thickness of a flange, which is necessary for bending a lead frame, can be reduced. Further, a rigid PCB as a supporting plate for mounting and soldering an LED onto an FPCB is not necessary, thereby enabling the reduction of the total height of an LED package.

Further, the present invention does not require soldering of a lead frame to an FPCB, resulting in no heat generation associated with the soldering. This enables highly reliable electrical connection, thereby improving the quality and reliability of LED. Further, it is possible to eliminate the above-mentioned design constraints on components attributable to soldering heat.

BRIEF DESCRIPTION OF THE DRAWINGS

In FIG. 2, a lens is provided for each LED.

DETAILED DESCRIPTION OF THE PREFERRED EMBODIMENT

Figure 1A:
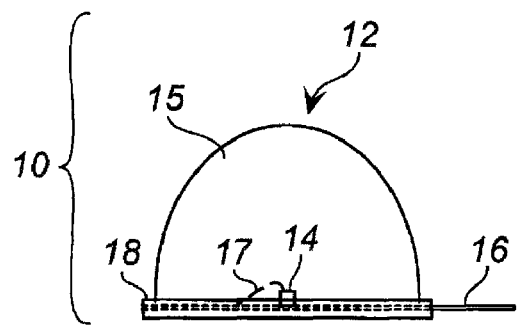
FIG. 1A is a side view of an LED package according to one embodiment of the present invention, wherein a connector is not provided on an FPCB.

Hereafter, some embodiments of LED packages wherein LED chips are connected to FPCBs without lead frames will be described by referring to the drawings.

Figure 1B:
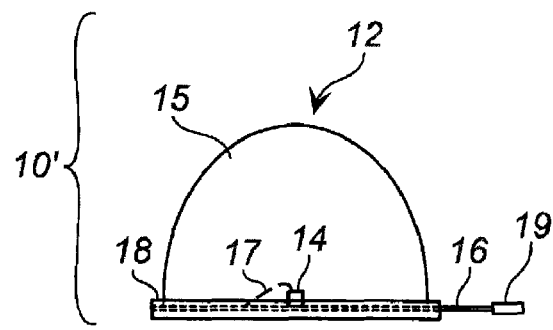
FIG. 1B is a side view of the LED package according to the embodiment of the present invention, wherein a connector is provided on the FPCB.
Figure 7:
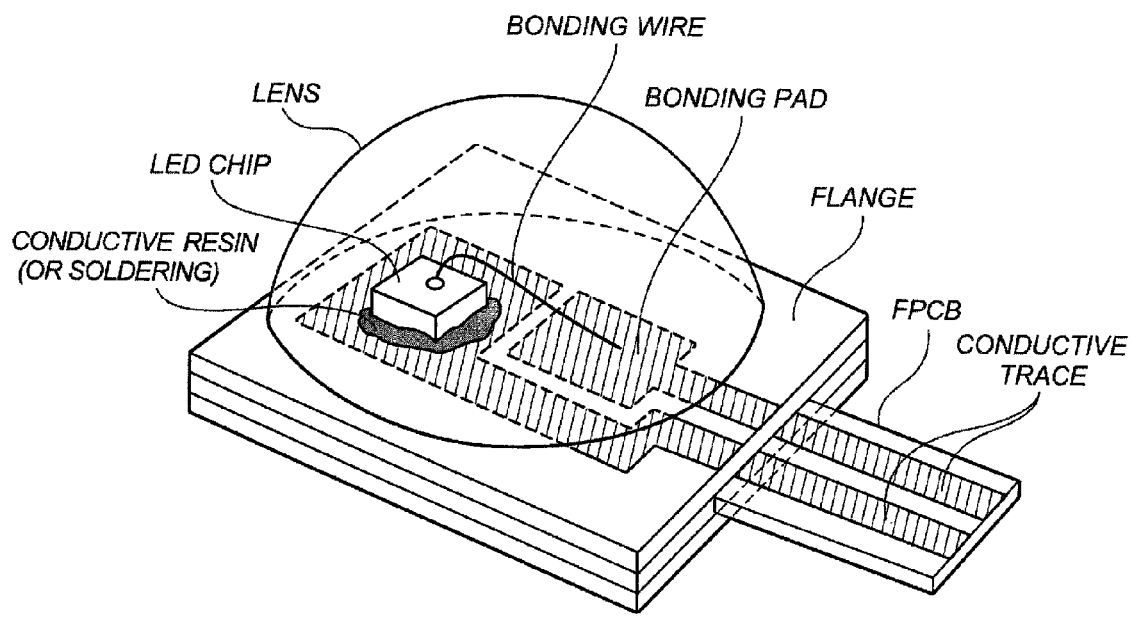
FIG. 7 is a schematic view illustrating one exemplary construction having an LED chip directly connected to an FPCB according to the present invention.

FIGS. 1A and 1B are side views showing LED packages 10 and 10', respectively, according to one embodiment of the present invention. An LED 12 has a structure similar to a conventional one (but a lead frame is excluded), which comprises an LED chip 14, an encapsulant 15 (encapsulation resin), a wire 17, and a flange 18. The package includes an FPCB 16 and a connector 19. In FIGS. 1A and 1B, like reference numerals refer to portions for which the same components are usable. In either structure, the FPCB is directly connected to the LED chip by a conductive resin or soldering, and a bonding wire as shown in FIG. 7. This direct connection can be achieved, for example, by: applying an epoxy resin containing silver paste to a location on the FPCB for mounting the LED chip; curing the resin in a high-temperature furnace after mounting the LED chip; and connecting the LED chip to the FPCB with the bonding wire. On at least one surface of the FPCB 16, a conductive trace (conductive pattern) as shown in FIG. 7 is formed.

The FPCB 16 is extended outwardly from the inside of the LED 12, and thus an electrical terminal such as a socket (or a connector) or a lead pad can be provided outside the LED, that is at a proper location on the FPCB outside the encapsulant, preferably near a far end of the FPCB for connection to the conductive trace. This permits electrical connection of the LED 12 to an external unit (e.g. a device, a circuit, and an electrical component) in one apparatus via the FPCB 16. The FPCB 16 preferably has a thickness of less than 0.5 mm, typically 0.05 mm to 0.2.

In the construction shown in FIG. 1A, a FPCB connector is not provided at an end of the FPCB 16 outside the LED 12. Instead, there is provided at the end of FPCB 16, but not shown, a lead pad (conductive pad) connectable to a connector extended from an external unit. On the other hand, in the construction shown in FIG. 1B, the connector 19 is provided at an end of the FPCB 16, and this connector 19 is connected to an FPCB extended from an external unit (not shown) thereby to electrically connect the LED to the external unit. In these constructions, the FPCB 16 passes through the flange 18, and it is apprehended that the height of the flange 18 is lower since a thickness for bending a lead frame is not necessary.

Then, a method for producing an LED package having a construction shown in FIGS. 1A and 1B is explained. This method can be applied to the production of other embodiments described in the present specification. Direct connection between an LED chip and an FPCB shown in FIG. 7 can be attained, for example, by this method.

A conductive resin (containing silver, for example) is applied to an electrode on an FPCB for mounting an LED chip, the LED chip is mounted on the electrode (this mounting may be achieved by soldering), and the conductive resin is cured in a high-temperature furnace. Next, an electrode of the upper surface of the LED chip is connected to the electrode on the FPCB by a bonding wire. Thereafter, a transparent encapsulant such as epoxy or silicone is used to seal the LED chip by the use of methods including casting, potting, or transfer molding, and at the same time a shape of the LED package is formed. Then, the FPCB is separated for an individual package, producing an individual package integrated with FPCB. In the case shown in FIG. 1B, it is preferable to attach a connector 19 to the FPCB 16 during the process of producing the FPCB.

Figure 2:
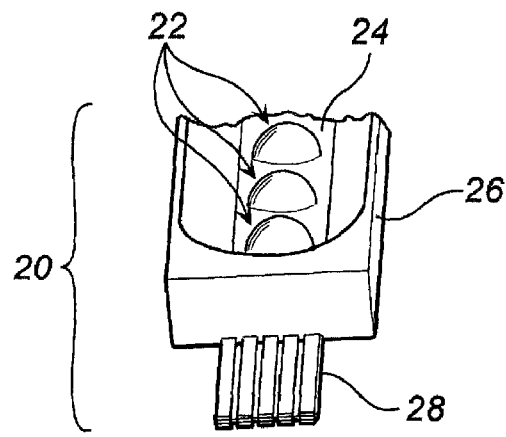
FIG. 2 is a perspective view partially illustrating an LED package according to another embodiment of the present invention, wherein the LED package comprises a plurality of LEDs and a reflector housing.

FIG. 2 is a perspective view partially illustrating an LED package 20 of the present invention, which comprises a plurality of LEDs 22 individually covered with a lens and a reflector housing 26 for reflecting light from LED chips (not shown). An encapsulant for each LED 22 can function as a lens. Such LED package is preferable for a low-profile line illumination.

In the construction shown in FIG. 2, a plurality of LEDs 22 share one FPCB 24, and each LED 22 can be electrically connected to an external unit (not shown) via a conductive trace (not shown) on the FPCB 24 and an electrical terminal 28. In this way, an FPCB can be shared by a plurality of LEDs. In the LED package structure of FIG. 2, the location of each LED, the light condensation and diffusion by each lens, and the depth and angle of the reflector can be optimized, depending on the usage. FIG. 2 shows that at least three LEDs are provided, but the number of LEDs may be one or two.

Figure 3:
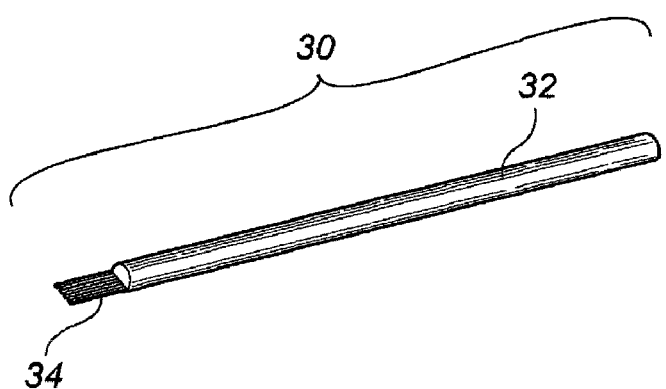
FIG. 3 is an external view of an LED package according to still another embodiment of the present invention, wherein the LED package comprises a cylindrical lens and an external flexible electrical terminal.

FIG. 3 is a perspective view of an LED package 30 according to one embodiment of the present invention, which comprises a cylindrical lens 32 and an external flexible electrical terminal 34. Inside the cylindrical lens 32, one or a plurality of LED chips (not shown) are disposed, and LEDs covered with the cylindrical lens 32 share one FPCB (not shown) in the same manner as in FIG. 2. The LEDs can be electrically connected to an external unit (not shown) via the electrical terminal 34. Flexible silicone, for example, may be used as an encapsulant for forming the cylindrical lens 32, thereby allowing the entire LED package 30 including the FPCB to have a flexible structure. Therefore, the LED package 30 can be used as a flexible low-profile line-type light source.

Figure 4:
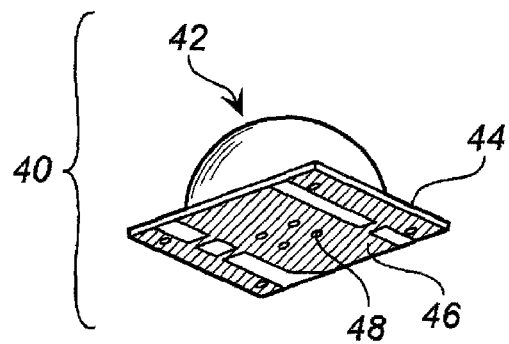
FIG. 4 is a perspective view of an LED package according to yet another embodiment of the preset invention, wherein via holes are provided for electrically and thermally connecting the top surface to the rear surface of an FPCB.

FIG. 4 is a perspective view of an LED package 40 according to one embodiment of the present invention, wherein an FPCB 46 (shaded area in the figure) directly connected to an LED 42 is provided on the rear surface of a flange 44 and a via hole 48 is formed for electrical and thermal connection between the top and rear surfaces of the FPCB 46. According to this construction, the rear surface of the FPCB 46 is connected to an external heat sink (not shown) by a low-thermal resistance method, thereby enhancing the heat radiation from an LED chip (not shown). The via holes are shown as a plurality of round openings drawn on the rear surface of the FPCB 46, but only one of them is indicated by a reference numeral 48 in FIG. 4 for convenience.

Figure 5A:
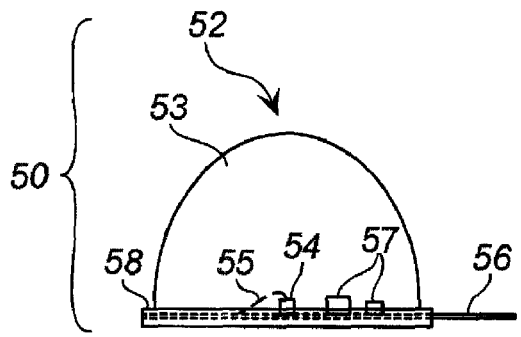
FIG. 5A is a side view illustrating an LED package construction carrying additional components on an FPCB according to one embodiment of the present invention, wherein the additional components are mounted inside the LED.
Figure 5B:
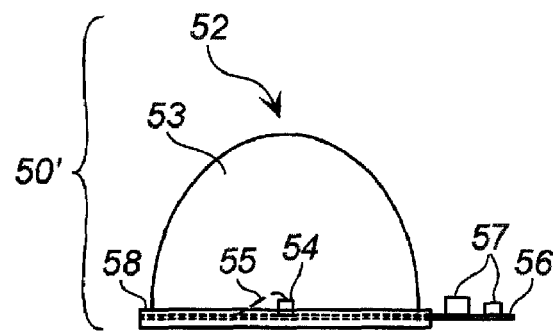
FIG. 5B is a side view illustrating an LED package construction carrying additional components on an FPCB according to the embodiment of the present invention, wherein the additional components are mounted outside the LED.

FIGS. 5A and 5B are side views of LED packages 50 and 50', respectively, according to one embodiment of the present invention, each mounting an additional component 57 mounted on an FPCB 56. In the figures, an LED 52 comprises an encapsulation resin 53, an LED chip 54, a wire 55, and a flange 58. In FIGS. 5A and 5B, like reference numerals refer to portions for which the same components are usable. The additional component 57 may be, for example, a driver for constant current drive, a current limiter including a resistor for limiting a driving current of an LED, an illuminant sensor for monitoring a light quantity of the LED chip, a color sensor for monitoring an emission wavelength of the LED chip, a thermal sensor for monitoring a temperature of the LED chip, or any other electrical components or integrated circuits.

In FIG. 5A, the additional component 57 is mounted on the FPCB inside the LED 52 by soldering or using a conductive resin. In FIG. 5B, the additional component 57 is mounted on the FPCB 56 extended outwardly from the LED 52. The additional component 57 may be different between FIGS. 5A and 5B, and any desired number of components can be provided as long as they can be mounted. Further, additional components can be disposed not only either inside or outside the LED but also both inside and outside. It is obvious that to mount an additional component on an FPCB inside and outside an LED is applicable not only to this embodiment but also to other embodiments shown in FIGS. 2 to 4, and FIG. 6.

According to the construction of this embodiment, a component can be directly mounted on an FPCB inside an LED in the same manner as a circuit is formed in and a component is mounted on an ordinary PCB or FPCB. Therefore, this construction enables an additional component to be mounted more easily in comparison with a conventional LED using a lead frame, and additionally provides a greater freedom degree for locations of mounting the additional component on the FPCB inside and outside the LED. A conventional LED employing soldering for attachment to the FPCB has a higher probability of defects attributable to soldering as the number of elements/components inside the LED increases. However, the present invention does not have such a problem since an additional component can be soldered before the sealing with an encapsulation resin. Therefore, it is easier and more highly reliable to provide an additional component at a proper location outside and inside an LED, and this provides flexibility in terms of LED circuit design.

Figure 6:
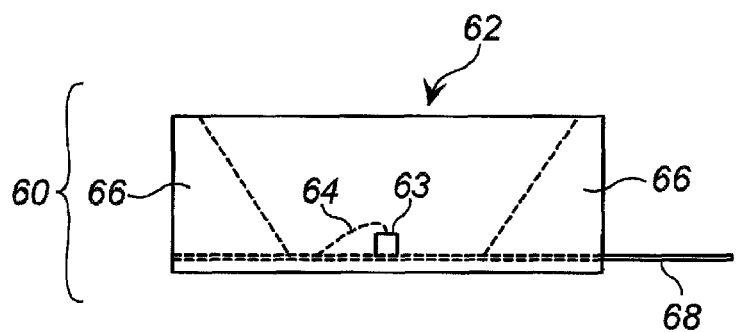
FIG. 6 is a side view of an LED package according to one embodiment of the present invention, wherein an FPCB is directly connected to an LED provided with a plastic housing serving as a reflector.

FIG. 6 is a side view of an LED package 60 according to one embodiment of the present invention, wherein an FPCB is directly connected to an LED 62 comprising a cup-shaped plastic housing 66 in addition to constituent elements such as an LED chip 63 and a wire 64. The housing 66 functions as a reflector. In the figure, broken lines indicate the construction inside the LED package. Further, a condenser lens may be provided over the LED 62.

The LED package 60 of FIG. 6 can be produced by insert-molding of the plastic housing 66 with the FPCB 68, and then conducting the same method as described for FIG. 1.

Figure 8:
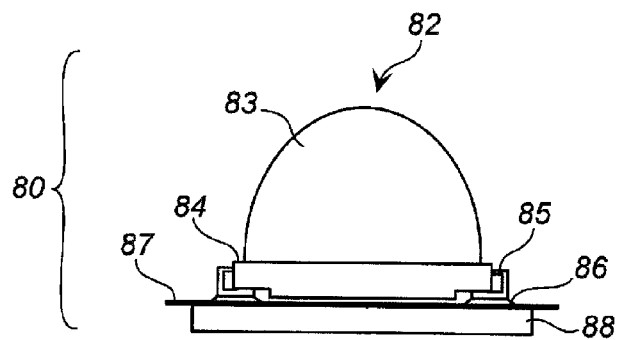
FIG. 8 is a side view of a conventional surface-mount LED package mounted on a mobile device

As described above, an LED package of the present invention does not require a lead frame, and thus it is not necessary to provide an extra thickness of the flange for bending the lead frame, thus reducing the height of the flange. Further, it is not necessary to provide a rigid PCB for supporting the LED package while soldering the LED package to an FPCB, so that the height of the present LED package is lower than a conventional LED package shown in FIG. 8. Furthermore, the LED package of the present invention can have a flat rear surface except for the case wherein the package has to be connected at its rear surface to an external unit by a method such as soldering as shown in the embodiment of FIG. 4. Thus, it is not necessary to separately prepare a supporting plate, which provides a flat surface for pressing the LED package by a leaf spring or the like.

These advantages of the present invention contribute to the thickness reduction particularly in compact electrical devices having LEDs mounted thereon, for example, mobile devices including digital still cameras and mobile phones. In the constructions shown in FIGS. 2, 3, and 6, no flanges are provided. According to the present invention, a light emitting diode package can be prepared with no flange depending on its usage. In such case, the present invention is much more advantageous for reducing the size of an LED package.

What is claimed is:

1. A light emitting diode package comprising:
a light source;
a flexible PCB;
an encapsulant for covering the light source;
wherein the flexible PCB is a thin substrate having first and second surfaces and the light source is disposed on the first surface of the flexible PCB so as to be directly connected to the flexible PCB;
wherein the flexible PCB has a thickness of less than 0.5 mm; and
wherein at least one via hole extends between said first and second surfaces of said flexible PCB.

2. The light emitting diode package according to claim 1, wherein the flexible PCB functions as a common substrate having the light source, the encapsulant, and other related components disposed thereon and as a substrate for electrical connection to an external unit by mechanical means without the use of soldering.

3. The light emitting diode package according to claim 1, wherein an electrical terminal for connection to an external electrical connector is provided on an end of the flexible PCB and the flexible PCB has a conductive trace on at least the first surface.

4. The light emitting diode package according to claim 3, wherein the electrical terminal is provided outside the encapsulant.

5. The light emitting diode package according to claim 3, further comprising a reflector housing.

6. The light emitting diode package according to claim 5, wherein the electrical terminal is provided outside the reflector housing.

7. The light emitting diode package according to claim 1, wherein at least one electrical component of a sensor, a resistor, and an integrated circuit is provided on the flexible PCB.

8. The light emitting diode package according to claim 1, wherein the light source comprises one or a plurality of LED chips and the one LED ,chip or the plurality of LED chips are covered with one lens.

9. The light emitting diode package according to claim 1, wherein the light source comprises a plurality of LED chips and each of a plurality of lenses covers each corresponding LED chip of the plurality of LED chips.

10. The light emitting diode package according to claim 3, wherein the electrical terminal is a connector or a lead pad.

* * * * *